United States Patent [19]

Reng

[11] Patent Number: 4,475,074
[45] Date of Patent: Oct. 2, 1984

[54] APPARATUS FOR DETERMINING THE COMMON FREQUENCY OF TWO INDEPENDENTLY VARIABLE ELECTRICAL A-C VARIABLES, ESPECIALLY IN A ROTATING-FIELD MACHINE

[75] Inventor: Leonhard Reng, Erlangen, Fed. Rep. of Germany

[73] Assignee: Siemens Aktiengesellschaft, Munich, Fed. Rep. of Germany

[21] Appl. No.: 456,437

[22] Filed: Jan. 7, 1983

[30] Foreign Application Priority Data

Feb. 1, 1982 [DE] Fed. Rep. of Germany ....... 3203257

[51] Int. Cl.$^3$ .............................................. H02P 5/36
[52] U.S. Cl. .................................... 318/800; 318/809
[58] Field of Search ................................ 318/798-811, 318/309-326, 327; 307/87, 355, 271; 364/484, 485, 850; 324/83 R, 83 A, 83 D, 83 FE, 83 FM; 328/133, 134; 322/23, 29, 31, 32

[56] References Cited

U.S. PATENT DOCUMENTS

| | | | |
|---|---|---|---|
| 3,662,251 | 5/1972 | Smith | 372/31 |
| 3,662,252 | 5/1972 | Smith | 324/177 |
| 3,876,946 | 4/1975 | La Clair et al. | 364/485 |
| 4,246,536 | 1/1981 | Bradley et al. | 324/177 |
| 4,272,715 | 6/1981 | Matsumoto | 318/807 |
| 4,282,473 | 8/1981 | Dreiseitl et al. | 318/803 |
| 4,306,297 | 12/1981 | Sugihara et al. | 364/850 |
| 4,321,518 | 3/1982 | Akamatsa | 318/810 |
| 4,329,645 | 5/1982 | Takase | 324/166 |
| 4,335,343 | 6/1982 | Drieisitl et al. | 318/803 |
| 4,363,099 | 12/1982 | Svinivasan et al. | 324/83 |
| 4,384,244 | 5/1983 | Matsumoto | 318/811 |
| 4,388,577 | 6/1983 | Blaschk et al. | 318/803 |

Primary Examiner—J. V. Truhe
Assistant Examiner—A. Evans
Attorney, Agent, or Firm—Kenyon & Kenyon

[57] ABSTRACT

An apparatus for determining the common frequency w of two independently variable a-c quantities is described. In a rotating-field machine, the flux, for instance, is described by two electrical a-c quantities which together determine the magnitude and direction of the field. The two a-c quantities are variable independently of each other and the instantaneous direction of the field is given by an angle $\alpha$ according to the relation $a_1/a_2 = \cot an\alpha$, where $a_1$ and $a_2$ are the two a-c quantities. In order to determine the frequency of rotation $w = d\alpha/dt$ of the field from these quantities, the quantities $a_1$ and $a_2$ are each fed to smoothing stages and thence to a computing circuit, wherein the quotient $(d_1 \cdot a_2 - d_2 \cdot a_1)/(d_1 \cdot a_1 + d_2 \cdot a_2)$ proportional to the frequency is formed from $a_1$ and $a_2$ and the smoothed quantities $d_1$ and $d_2$. The use of differentiators is thereby avoided, which would cause a phase error as well as difficulties when harmonics of the quantities $a_1$ and $a_2$ are present.

5 Claims, 3 Drawing Figures

APPARATUS FOR DETERMINING THE COMMON FREQUENCY OF TWO INDEPENDENTLY VARIABLE ELECTRICAL A-C VARIABLES, ESPECIALLY IN A ROTATING-FIELD MACHINE

BACKGROUND OF THE INVENTION

The present invention relates to apparatus for determining the common frequency w of two independently variable electrical a-c quantities denoted herein $a_1$ and $a_2$, wherein an angle quantity $\alpha$ varying with frequency w is associated with the a-c quantities $a_1$ and $a_2$ according to the relation $a_1/a_2 = \cotan \alpha$.

A preferred field of application of the invention is the field-oriented control or regulation of a rotating-field machine drive. As used herein, rotating field machines comprise both synchronous and asynchronous machines. Such a drive comprises a rotating-field machine having power fed from a static frequency converter with apparatus for controlling or regulating the converter. This apparatus requires as an input control variable an angle which can be determined in a flux-determining device and which describes the instantaneous direction of the field axis, (for instance, in the form of two a-c variables $\sin \alpha$, $\cos \alpha$, where $\alpha$ may be the angle between the field axis and the axis of the stator winding). Furthermore, reference values are also inputs to the control apparatus which determine the components of the stator magnetization of the stator current parallel to the field axis and perpendicular thereto. With the component parallel to the field, the magnitude of the field can be set to a value, in particular, a constant value which is an optimum for the utilization of the frequency converter and the rotating-field machine, while independently thereof, the torque and the speed can be set by the field-parallel component in accordance with the requirements of the drive.

Such a drive is described in U.S. Pat. No. 4,282,473, corresponding to German Pat. No. 28 33 542 and in U.S. Ser. No. 279,352 filed July 1, 1981, corresponding to German patent Application No. P 30 26 202.3, all commonly owned by the assignee of this application, wherein the flux determining device determines, first, from stator currents and stator voltages, two electrical variables which are related to the EMF of the machine. By integration, the two electrical variables are determined from which the field with respect to the above-mentioned angle $\alpha$ as well as the magnitude of the field can be determined. This flux-determining device utilizes the instantaneous operating frequency w to provide, by setting a frequency-dependent amplification parameter, an adaptation to the respective operating state and ultimately, optimum attenuation of disturbing harmonics at any operating frequency. An adaptation to the prevailing operating frequency can advantageously also be made at other points of the machine drive. In the steady state, the operating frequency of a synchronous machine, for instance, is equal to the frequency of the rotating field, so that on occasion, the machine frequency itself has been used even where it would have been better to use the frequency of the rotating field.

The resulting electric magnetization of the stator which is determined by the current components of the individual stator windings, or the resultant stator current, can be represented by two variables $a_1$ and $a_2$ which determine the angle of the magnetization axis relative to a stationary axis, for instance, the axis of a stator winding. By the quantity $c = \sqrt{a_1^2 + a_2^2}$, the magnitude of the electric flux linkage can be determined. The desired direction $\alpha^*$ of the stator current can thereby be formed from two set values $a_1^*$, $a_2^*$ for the stator current which are derived from the aforementioned reference values for the field parallel and field perpendicular stator current components and can be recalculated into the reference values $i_a^*$, $i_b^*$, $i_c^*$ for the stator currents in accordance with $$i_a^* = a_1,$$

$$i_b^* = -\tfrac{1}{2} a_1 + \sqrt{3}/2 \, a_2,$$

$$i_c^* = -\tfrac{1}{2} a_1 - \sqrt{3}/2 \, a_2,$$

or the actual stator current can be described by the two a-c variables $a_1$, $a_2$ which are obtained from two actual stator winding values by reversing these relations.

It may also be advantageous to determine the change in direction of the total magnetization, i.e., the frequency at which, for instance, the angle between the stator current and the stationary reference axis changes from the predetermined or measurement-wise accessible a-c variables $a_1$ and $a_2$. Since in field-oriented operation, the current components which are parallel and perpendicular to the field, respectively, are given independently of each other, the a-c quantities $a_1$ and $a_2$ also are accordingly variable; the frequency $w = d\alpha/dt$ therefore depends not only on one a-c quantity and its change in time, but also on the other a-c quantity (or the amplitude c) and its change. Due to these dependencies it can be expected that the frequency of change of the angle $\alpha$ can be calculated only with a relatively high cost apparatus.

Determination of the change of direction (for instance, the frequency of rotation relative to the rotor shaft) of the field and of the electric stator magnetization of a rotating-field machine, are only two conspicuous applications for the problem which occurs frequently in three-phase technology, namely, determination of the common frequency w from two a-c quantities $a_1$ and $a_2$ which depend via an angle variable $\alpha$ (for instance, a phase difference) variable with the frequency w according to the relation $a_2/a_1 = \tan \alpha$.

Although this frequency w depends on the a-c quantities themselves and also on the changes in time thereof as already mentioned, the use of differentiating circuits is not appropriate for determining the frequency w because differentiating circuits have only a limited computing range, which is quickly exceeded if the input variables have heavy harmonics or change in almost step-like fashion. In addition, differentiating circuits necessarily cause phase errors which lead to disturbing calculation errors, especially at high speeds of rotation.

It is therefore an object of the present invention to provide an apparatus for determining the common frequency w of two independently variable a-c variables.

It is a further object to provide such an apparatus which can be used in conjunction with a rotating field machine drive.

It is yet a further object to provide such an apparatus which avoids the use of differentiating stages.

SUMMARY OF THE INVENTION

These and other objects of the invention are achieved by a circuit in which the electrical a-c variables $a_1$ and $a_2$ are fed to respective smoothing stages (first-order time delay stages) which generate corresponding respective smoothed variables $d_1$ and $d_2$, and in which, furthermore, the quotient $(d_1 \cdot a_2 - d_2 \cdot a_1)/(d_1 \cdot a_1 + d_2 \cdot a_2)$ is generated by computer means as the quantity proportional to the frequency w, the computer means carrying out only static computing operations, the a-c variables $a_1$ and $a_2$ and the smoothed output variables $d_1$ and $d_2$ being connected thereto. The computer means is preferably constructed only of multipliers, adding stages and one or several dividers. Preferably, the a-c variables $a_1$ and $a_2$ are fed to the smoothing stages and the computer means as normalized quantities via a normalizing circuit which forms from the a-c quantities $a_1$ and $a_2$ the normalized quantities:

$$a_{1o} = a_1/\sqrt{a_1^2 + a_2^2}; \quad a_{2o} = a_2/\sqrt{a_1^2 + a_2^2}.$$

BRIEF DESCRIPTION OF THE DRAWINGS

The circuit according to the invention as well as its application in a three-phase rotating-field machine drive will be explained in greater detail with reference to the drawings, in which.

DETAILED DESCRIPTION

Figure 1:
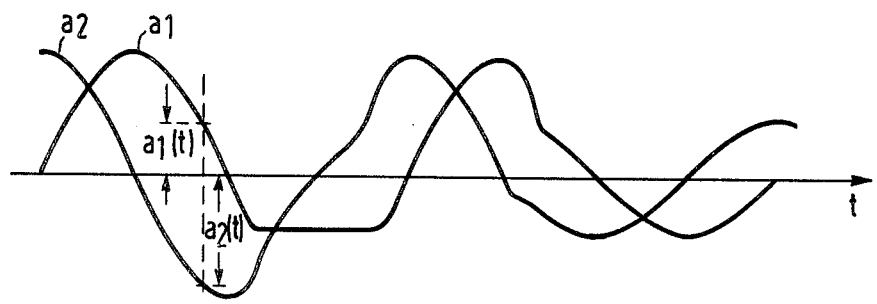
FIG. 1 shows the waveforms of two independently variable electrical a-c variables $a_1$ and $a_2$ which at every instant have an angle $\alpha$ common to the two a-c variables determined by the relation $a_1/a_2 = \cotan \alpha$ and wherein the common frequency is determined by the relation $w = d\alpha/dt$.

In the following it is assumed that the common frequency w is constant, so that the angle quantity $\alpha$ is a linear function of time t, $\alpha = w \cdot t$, and the angle determining quantities are determined by a time-dependent quantity c(t) according to $a_1/\cos \alpha = a_2/\sin \alpha = a_2/\cos(\alpha - \pi/2) = c(t)$. This is shown in FIG. 1, where c(t) assumes in the first half-wave of $a_1$ a constant, higher value and in the second half-wave temporarily a smaller value. In the third half-wave, a transition to a lower value of c(t) takes place, which is retained in the fourth half-wave.

Such conditions prevail, for instance, in a rotating-field machine, where c(t) represents the magnitude and w the frequency of rotation of the magnetic field, while the a-c quantities $a_1$ and $a_2$ are, for instance, the Hall voltages of two probes which are offset relative to each other by 90°. In order to determine the rotating magnetic field components, simulated voltages which are derived from the stator voltages and currents can be used instead of the Hall voltages. The angle $\alpha$ corresponds here to the angle between the magnetic field axis and a stator-related reference axis. FIG. 1 makes clear that the change of the angle $\alpha$ is not immediately evident from the waveform of the a-c quantities $a_1$ and $a_2$, even if $w = d\alpha/dt$ is constant. In general, an even more confusing situation results, when w is not constant, although a common frequency can still be ascribed to the a-c quantities $a_1$ and $a_2$.

Figure 2:
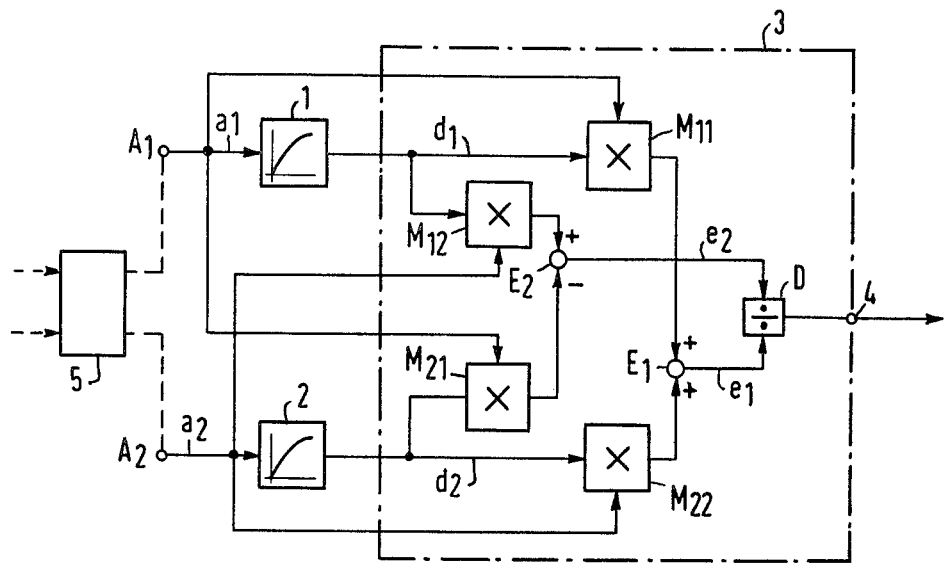
FIG. 2 shows a block diagram of a circuit according to the invention for determining the frequency w.

In order to determine the respective instantaneous values of this common frequency, the circuit shown in FIG. 2 is provided. The a-c quantities $a_1$ and $a_2$ are fed to the inputs $A_1$ and $A_2$. For each of the a-c quantities, smoothing stages 1 and 2, respectively, are provided which have the same transfer behavior (first-order delay stages, transfer function $V/(1+sT)$ with the proportional gain V and the time constant T). The output variables $d_1$ and $d_2$ of the two smoothing stages are fed to the respective first multipliers $M_{11}$ and $M_{22}$ in the computer circuit 3 to form the products $a_1 \cdot d_1$ and $a_2 \cdot d_2$. The output signals of the two multipliers are fed to a first summing point $E_1$, at the output of which the quantity $e_1 = d_1 \cdot a_1 + d_2 \cdot a_2$ is present. The computing circuit 3 is further provided with two further multipliers $M_{12}$ and $M_{21}$ for forming the products $d_1 \cdot a_2$ and $d_2 \cdot a_1$, the outputs of which are fed to a second summing point $E_2$, at the output of which the quantity $e_2 = d_1 \cdot a_2 - d_2 \cdot a_1$ is present. A divider D forms from the output signals of the two summing points the quotient $e_2/e_1$, which is provided at the output 4 of the computing circuit and which is found to be directly proportional to the desired frequency w. It is also found that the proportionality constant is equal to the time constant of the identical smoothing stages 1 and 2, respectively.

FIG. 2 shows the design of the computing circuit 3 having four multipliers, two summing stages and one divider. The mathematical operations can also be performed in another order (possibly using several dividers) to obtain the quotient proportional to the desired frequency. It is important that only static computing stages be used for this purpose, i.e., computing stages which depend only on the instantaneous values of the input variables and which exhibit no frequency or time-dependent transfer behavior.

The amplitudes of the output variables of the summing stages $E_1$ and $E_2$ become smaller as $(a_1^2 + a_2^2)$ becomes smaller, which can become important for the accuracy and the computing range of the divider D. It is therefore advantageous if the inputs $A_1$ and $A_2$ are preceded by a normalizing circuit 5 which converts the a-c quantities $a_1$ and $a_2$ into correspondingly normalized a-c quantities $a_1/\sqrt{a_1^2 + a_2^2}$ and $a_2/\sqrt{a_1^2 + a_2^2}$. These normalized a-c quantities are then fed to the smoothing stages and the computing circuit without any change in the value of the signal proportional to frequency obtained at output 4.

Figure 3:
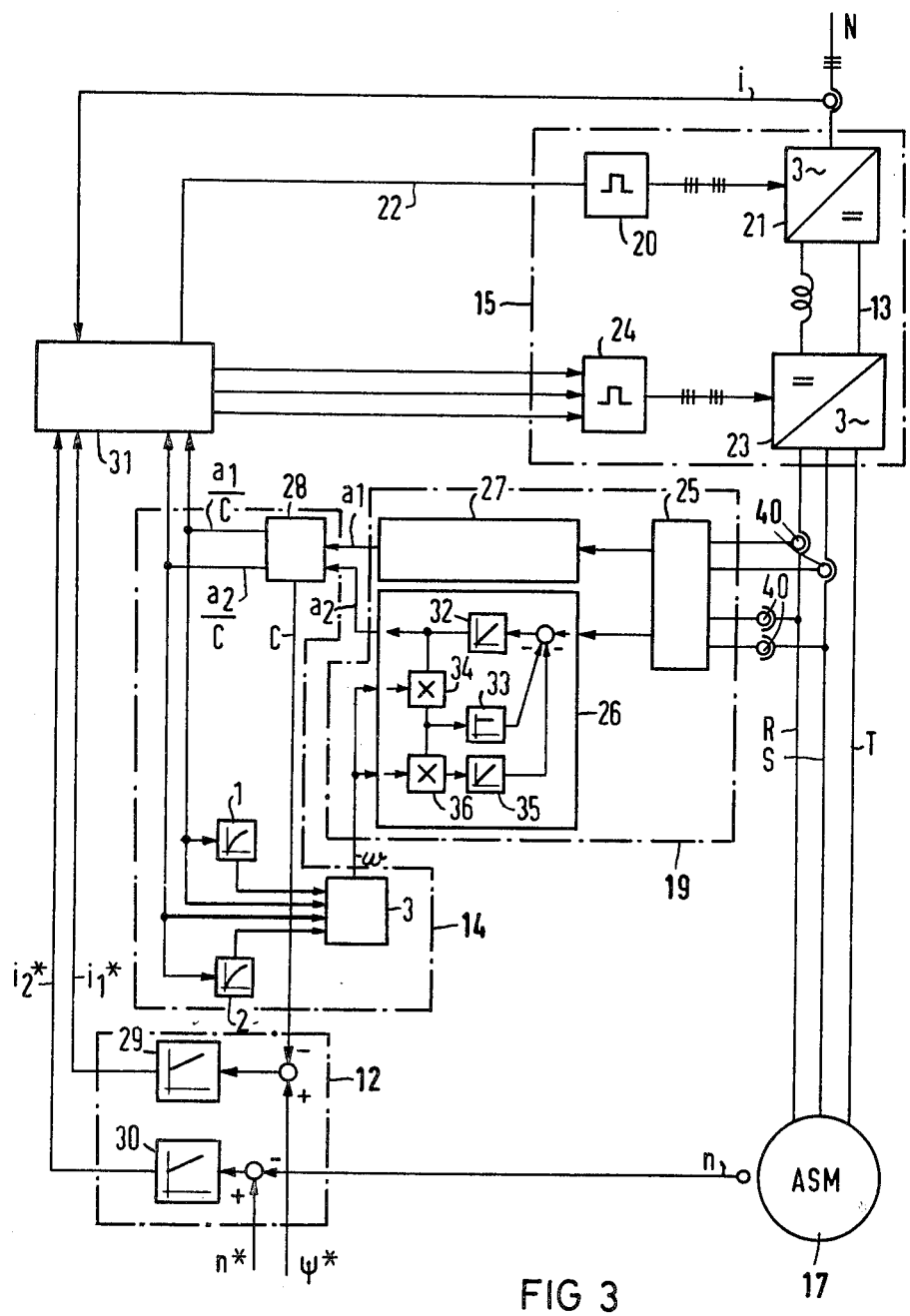
FIG. 3 shows schematically a block diagram of apparatus for controlling a rotating-field machine which utilizes the circuit of FIG. 2.

The apparatus according to the invention can be used, for instance, in a rotating-field machine drive as shown in FIG. 3. The drive comprises a converter 15, a rotating-field machine 17, for instance, an asynchronous machine, a flux-determining circuit 19, a frequency-converter control 31 and reference circuitry 12. The circuit of FIG. 2 according to the invention is denoted by reference number 14.

The frequency converter 15 may comprise for instance, rectifier 21, inverter 23 and intermediate link 13 with impressed d-c current. By way of a control unit 20, the rectifier 21 on the 3-phase network side is controlled so that the intermediate link current assumes a reference value which corresponds to the desired magnitude of the stator magnetization of the asynchronous machine 17. The inverter 23 on the load side is controlled by control unit 24 in such a way that the intermediate link current is distributed to the three-phase outputs R, S, T and the windings of the stator connected thereto in such a way that a predetermined direction for the stator magnetization is obtained in the stator.

Actual values for the stator current and the stator voltage are fed to the flux-determining apparatus 19. These actual values are obtained by measuring transformers 40 at the stator inputs of the rotating-field machine. From these values, two quantities which measure the magnitude and direction of the EMF of the machine are formed in an EMF detector circuit 25, as is described, for instance, in German Patent Application No. 30 34 275.7. These electrical quantities are fed to respective a-c voltage integrating circuits 26 and 27 which form therefrom by integration the a-c quantities $a_1$ and $a_2$ which together determine the magnitude and direction of the field of the machine. Subsequently, these a-c quantities are converted in normalizing circuit 28, which forms the normalizing quantity $c = \sqrt{a_1^2 + a_2^2}$ into correspondingly normalized a-c quantities $a_1/c$ and $a_2/c$, where these normalized a-c quantities now describe the direction of the field in the machine.

For controlling the machine, a control deviation which is fed to a suitable controller 29 forming a reference value $i_1^*$ therefrom, is formed from the normalizing quantity c and a reference value $\Psi^*$ for the magnitude of the field. A second reference value $i_2^*$ is formed, for instance, by a controller 30, to which the control deviation between the speed of rotation n of the machine and a predetermined speed reference value $n^*$ is fed. The two reference values $i_1^*$ and $i_2^*$ determine the stator magnetization as to its magnitude and direction (relative to the field axis).

From these two reference values and the normalized a-c quantities, the control device 31 determines, on the one hand, the desired magnitude of the stator current which is required by the control unit 20, and, on the other hand, the distribution of the stator current over the three phase inputs R, S, T of the asynchronous machine which is required by the control unit 24.

The a-c voltage integrators 26 and 27 required for determining the flux are designed so that they suppress zero drift. To this end, each electrical output quantity of the EMF detector is fed to an integrator 32, the output quantity of which, namely, the a-c quantity $a_1$ or $a_2$, is fed back via a feedback line with a zero-control circuit to the integrator input. This zero control circuit contains a P-controller 33, to which is fed via a multiplier 34 the corresponding a-c quantity, amplified by a factor which depends on the frequency w of the field. Further provided is an I-controller 35, to which is fed, via another multiplier 36, the a-c quantity amplified by a further factor which depends on the frequency w. Both controller outputs are fed to the integrator input. However, it may also be provided to feed to the integrator input further quantities, as is described in the aforementioned U.S. Ser. No. 279,352 or in German Patent Application No. 30 26 202.3. The description of P and I controllers can be found, for example, in U.S. Pat. No. 4,335,343, owned by the assignee of the present application. These devices are well known in the art.

Due to the frequency-dependent factors in the zero control circuit, i.e., the frequency dependent multipliers 34 and 36, it follows not only that zero drift of the integrators is suppressed, but also that integration errors are avoided almost completely in the entire frequency range. In particular, the entire drive can always be damped in an optimum manner adapted to the prevailing operating state.

In order to determine the frequency w of the field, the apparatus of FIG. 2 is employed, and the fact can be utilized that with the design of the drive described above, the normalized a-c quantities $a_1/c$ and $a_2/c$ are already available, in addition to the a-c quantities $a_1$ and $a_2$. The normalizing circuit shown in FIG. 2 can therefore be dispensed with; the normalized a-c quantities are rather fed directly to the smoothing stages 1 and 2 and to the computing circuit 3 in order to determine the frequency of the field.

In the foregoing specification, the invention has been described with reference to a specific exemplary embodiment thereof. It will, however, be evident that various modifications and changes may be made thereunto without departing from the broader spirit and scope of the invention as set forth in the appended claims. The specification and drawings are, accordingly, to be regarded in an illustrative rather than in a restrictive sense.

What is claimed is:

1. In an apparatus having two independently variable electrical a-c quantities $a_1$ and $a_2$ supplied as respective inputs for determining a common frequency w of the two electrical a-c quantities, wherein an angle quantity $\alpha$ variable with the common frequency w is related to the a-c quantitites $a_1$ and $a_2$ such that $a_1/a_2 = \text{contan } \alpha$, the improvement comprising:
   first smoothing stage means having said a-c quantity $a_1$ supplied as an input for producing a smoothed quantity $d_1$;
   second smoothing stage means having said a-c quantity $a_2$ supplied as an input for producing a smoothed quantity $d_2$, said second smoothing stage means being substantially identical to said first smoothing stage means;
   computing means, having said a-c quantities $a_1$ and $a_2$ and said smoothed quantities $d_1$ and $d_2$ supplied as respective inputs, for generating, as an output, a quantity $(d_1 \cdot a_2 - d_2 \cdot a_1)/(d_1 \cdot a_1 + d_2 \cdot a_2)$ proportional to said common frequency w.

2. The improvement recited in claim 1 wherein said computing means comprises summing means, multiplying means and at least one dividing means for generating said quantity proportional to said common frequency.

3. The improvement recited in claim 1, wherein said computing means comprises:
   first multiplying means having said quantities $a_1$ and $d_1$ as inputs for forming the product $d_1 \cdot a_1$;
   second multiplying means having said quantities $a_2$ and $d_2$ as inputs for forming the product $d_2 \cdot a_2$;
   first summing means coupled to said first and second multiplying means for forming the quantity $d_1 \cdot a_1 + d_2 \cdot a_2$;
   third multiplying means having said quantities $d_1$ and $a_2$ as inputs for forming the product $d_1 \cdot a_2$;
   fourth multiplying means having said quantities $d_2$ and $a_1$ as inputs for forming the product $d_2 \cdot a_1$;
   second summing means coupled to said third and fourth multiplying means for forming the quantity $d_1 \cdot a_2 - d_2 \cdot a_1$; and
   dividing means coupled to said first and second summing means for forming the quotient $$\frac{d_1 \cdot a_2 - d_2 \cdot a_1}{d_1 \cdot a_1 + d_2 \cdot a_2}$$

proportional to said common frequency w.

4. The improvement recited in claim 1, further comprising normalizing means, having said a-c quantities $a_1$ and $a_2$ as inputs, for forming, as outputs, the normalized a-c quantities $$a_{10} = \frac{a_1}{\sqrt{a_1^2 + a_2^2}} \text{ and}$$

-continued $$a_{20} = \frac{a_2}{\sqrt{a_1^2 + a_2^2}},$$

said outputs coupled to the inputs of said respective smoothing means.

5. The improvement recited in claim 1 in combination with a field-oriented control rotating-field machine drive, said machine drive including means for determining said a-c quantities $a_1$ and $a_2$ which together determine the magnitude and direction of the machine flux of a rotating-field machine, said means for determining having frequency dependent amplifying means controlled by said common frequency w coupled to the output of said computing means.

* * * * *